United States Patent
Casper et al.

(10) Patent No.: US 8,362,368 B2
(45) Date of Patent: Jan. 29, 2013

(54) METHOD AND APPARATUS FOR AN IMPROVED FILLED VIA

(75) Inventors: Michael Casper, Hollis, NH (US);
Craig Hare, Merrimack, NH (US);
Adam Cook, Manchester, NH (US)

(73) Assignee: Ultrasource, Inc., Hollis, NH (US)

( * ) Notice: Subject to any disclaimer, the term of this patent is extended or adjusted under 35 U.S.C. 154(b) by 359 days.

(21) Appl. No.: 12/729,511

(22) Filed: Mar. 23, 2010

(65) Prior Publication Data
US 2010/0270062 A1  Oct. 28, 2010

Related U.S. Application Data

(60) Provisional application No. 61/172,935, filed on Apr. 27, 2009.

(51) Int. Cl.
*H05K 1/11* (2006.01)
*H05K 3/36* (2006.01)

(52) U.S. Cl. .......................................... 174/262; 29/830

(58) Field of Classification Search .......... 174/262–266; 361/792–795; 29/830, 840
See application file for complete search history.

(56) References Cited

U.S. PATENT DOCUMENTS

| | | |
|---|---|---|
| 4,032,350 A | 6/1977 | Greenstein |
| 4,925,723 A | 5/1990 | Bujatti et al. |
| 4,942,076 A | 7/1990 | Panicker et al. |
| 5,159,433 A | 10/1992 | Kazami et al. |
| 5,285,107 A | 2/1994 | Kazami et al. |
| 5,519,176 A | 5/1996 | Goodman et al. |
| 5,565,706 A | 10/1996 | Miura et al. |
| 5,599,744 A | 2/1997 | Koh et al. |
| 5,717,247 A | 2/1998 | Koh et al. |
| 5,832,600 A | 11/1998 | Hashimoto |
| 5,916,425 A | 6/1999 | Leader et al. |
| 5,922,245 A | 7/1999 | Mohri et al. |
| 6,066,889 A | 5/2000 | Jones et al. |
| 6,090,436 A | 7/2000 | Miyoshi |
| 6,243,945 B1 | 6/2001 | Fujimoto et al. |
| 6,830,823 B1 | 12/2004 | Kodas et al. |
| 7,297,469 B2 | 11/2007 | Toyota et al. |
| 2001/0006456 A1 | 7/2001 | Fujimoto et al. |
| 2005/0064707 A1 | 3/2005 | Shinha |
| 2005/0146049 A1 | 7/2005 | Kripesh et al. |
| 2006/0078829 A1 | 4/2006 | Toyota et al. |
| 2007/0222083 A1 | 9/2007 | Kripesh et al. |
| 2008/0000678 A1 * | 1/2008 | Johnston et al. .............. 174/262 |
| 2008/0247703 A1 | 10/2008 | Kodama et al. |

FOREIGN PATENT DOCUMENTS

| | | |
|---|---|---|
| JP | 2001332650 A | 11/2001 |
| KR | 1020000059312 A | 10/2000 |

* cited by examiner

*Primary Examiner* — Jeremy Norris
(74) *Attorney, Agent, or Firm* — Hayes Soloway P.C.

(57) ABSTRACT

The system contains a substrate having at least one electrical trace formed thereon. An opening is formed in the substrate. The opening comprising at least one wall. An electrically conductive fill is formed in the opening. The electrically conductive fill is chemically bonded to the wall and electrically contacted with the electrical trace.

20 Claims, 4 Drawing Sheets

METHOD AND APPARATUS FOR AN IMPROVED FILLED VIA

CROSS REFERENCE TO RELATED APPLICATION

This application claims benefit of U.S. Provisional Application Ser. No. 61/172,935 filed Apr. 27, 2009, the entire disclosure of which is incorporated herein by reference.

FIELD

The present disclosure is generally related to filled vias and more particularly is related to a method and apparatus for an improved filled via.

BACKGROUND

Filled vias are utilized in circuit manufacturing. As an example, a circuit may be formed on each side of a substantially flat substrate. To electrically connect elements on opposing sides of the substrate, a hole or via may be formed in the substrate, which is filled with a conductive material or fill. The electrical elements then utilize the conductive material to form an electrical path through the substrate. The hole filled with conductive material is an example of a filled via.

One common method of forming a filled via is to insert a paste made substantially with metal and glass. The paste is heated to a high temperature and, as it cools within the via, it forms a mechanical connection with the walls of the via. Up to approximately 80-85% of the paste may be metal and at least 10% of the paste may be glass. The glass is important because without the glass, or a comparable substance, the metal would be unable to form an adequate mechanical connection with the walls of the via. Also, other conductive metals beyond gold may be utilized in the paste, but gold is recognized as having more favorable properties as compared with other available metals. Tungsten and Copper Tungsten are examples of other compatible metals, for this process, although each still requires a significant percentage of glass or comparable substance.

FIG. 1 is an illustration of a cross-sectional view of a metal-glass paste composite filled via 10 as is known in a first exemplary embodiment of the prior art. A substrate 12 is shown with a hole formed therein, bordered by a wall 14. Within the wall 14, a first paste 16 is utilized to fill the hole, heated and cooled as previously described. The first paste 16 is usually applied and fired at atmosphere. Due to differences in the coefficient of thermal expansion of the first paste 16 and the substrate 12, gaps or crevices may develop between the wall 14 and the first paste 16 as it cools. A second paste 18 is thereafter applied and fired in a second process of heating and cooling. And a third paste 20 is thereafter applied and fired in a third process of heating and cooling. Each of the firing processes may take place in atmosphere or in special environments. The second and third pastes 18, 20 are applied to seal the first paste 16 and prevent foreign substances from entering any gaps in the first paste 16. However, gaps or voids in any of the layers may cause blisters in the pastes 16, 18, 20 during subsequent processing. Since these circuits may be used in high-performance military or commercial applications, blisters compromise the integrity of the filled via 10, increase cost and decrease reliability.

While described as 'pastes', it should be noted that, after cooling, each of the pastes has the approximate rigidity of metal. Also, as glass is not a good conductor of heat or electricity, a metal and glass paste is not as good a conductor of heat or electricity as a pure metal system would be.

FIG. 2 is an illustration of a cross-sectional view of an electroplate filled via 10A as is known in a second exemplary embodiment of the prior art. A substrate 12A is shown with a hole formed therein, bordered by a wall 14A. A conductive film 16A is applied to one side of the substrate. The substrate is then electroplated with a material 18A and the via is filled to form metal "pillars" 20A in the via. These vias are not well bonded to the substrate 12A and suffer blistering and reliability issues similar to the metal and glass composite filled vias.

A via filling process that requires fewer process steps, provides a hermetic bond to the substrate, and/or allows for greater thermal and electrical conductivity would be desirable.

SUMMARY

Embodiments of the present disclosure provide a system and method for filling a via. Briefly described, in architecture, one embodiment of the system, among others, can be implemented as follows. The system includes a substrate. At least one opening is formed in the substrate. The opening includes at least one wall. A metallic adhesion layer is formed in the opening and chemically bonded to the wall. A braze fill material is deposited in the opening and chemically bonded to the metallic adhesion layer.

The present disclosure can also be viewed as providing methods for filling a via. In this regard, one embodiment of such a method, among others, can be broadly summarized by the following steps: forming an opening in a substrate, wherein the opening comprises at least one wall; chemically bonding a metallic adhesion layer to the wall; and chemically bonding a braze fill material to the metallic adhesion layer to fill the opening.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Many aspects of the invention can be better understood with reference to the following drawings. The components in the drawings are not necessarily to scale. Instead emphasis is being placed upon illustrating clearly the principles of the present disclosure. Moreover, in the drawings, like reference numerals designate corresponding parts throughout the several views.

DETAILED DESCRIPTION

Figure 1:
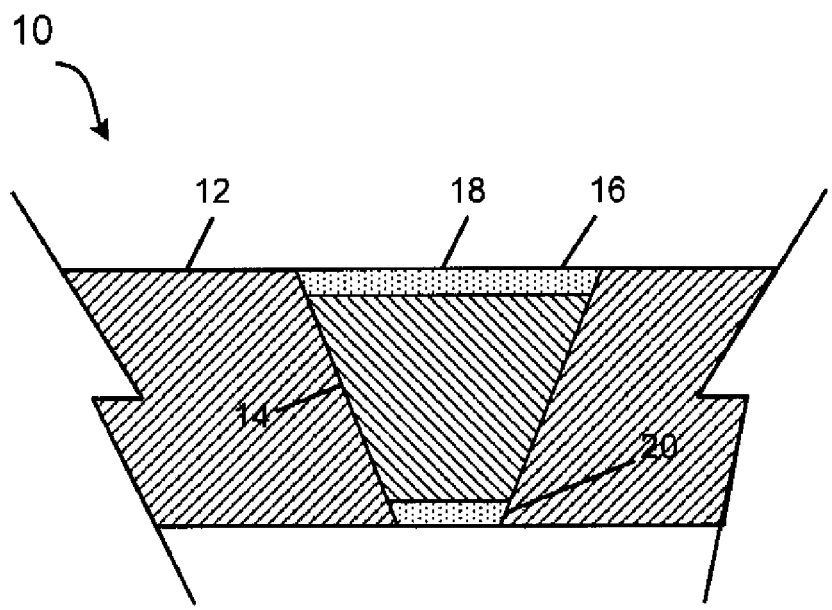
FIG. 1 is an illustration of a cross-sectional view of a metal-glass composite filled via as is known in a first exemplary embodiment of the prior art.
Figure 2:
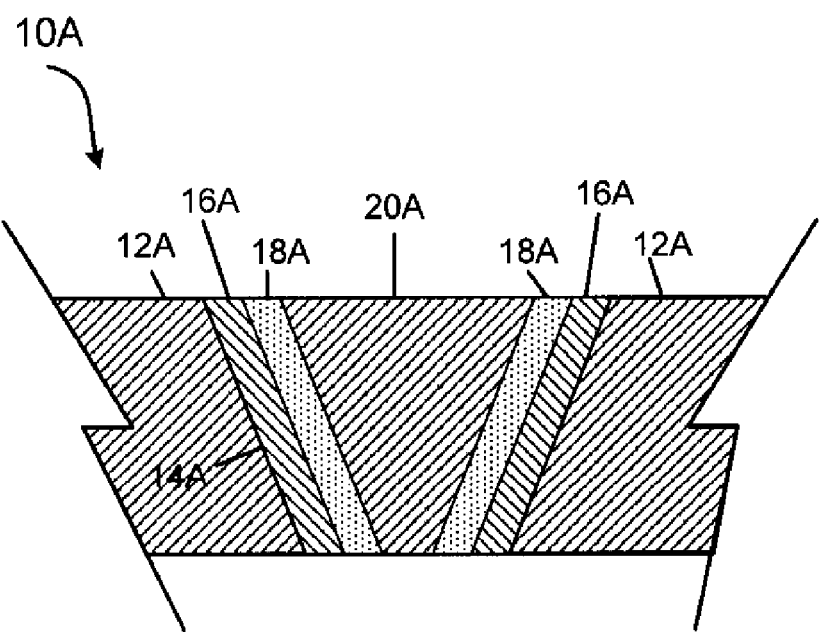
FIG. 2 is an illustration of a cross-sectional view of an electroplated filled via as is known in a second exemplary embodiment of the prior art.
Figure 3:
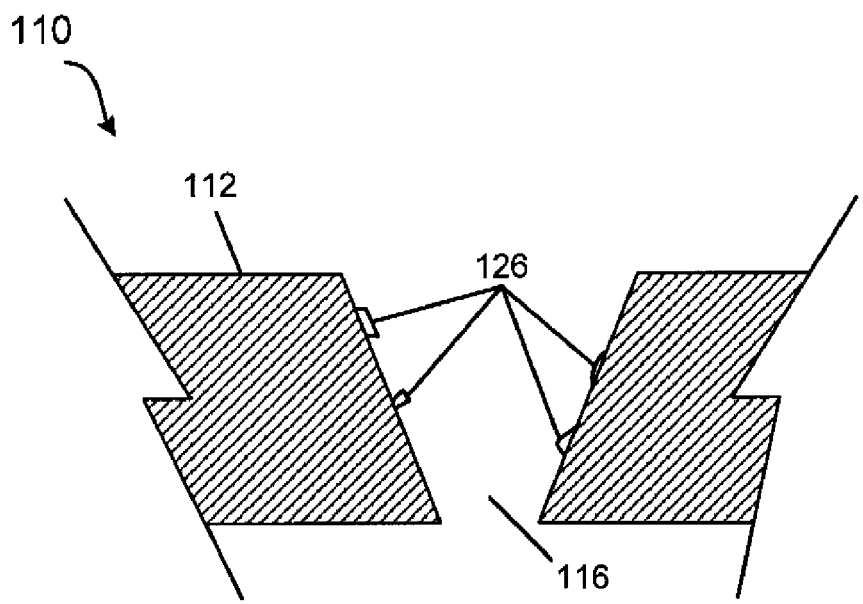
FIG. 3 is an illustration of a cross-sectional view of a via, in accordance with the first exemplary embodiment of the present disclosure.

FIG. 3 is an illustration of a cross-sectional view of a via 110, in accordance with the first exemplary embodiment of the present disclosure. An opening 116 is formed in the substrate 112. The substrate 112 may be made of a ceramic or glass, or any other material known in the art for forming a substrate. The opening 116 includes at least one wall 118. The opening 116 in the substrate 112 may be, for example, prefabricated, drilled, or ablated with a laser. The opening 116 need not extend entirely through the substrate 112, but may be a cavity or, what his referred to in the art as, a blind via. Drilling, in some circumstances, may be performed with a diamond-tipped drill or with water-jet machining to minimize damage to the substrate 112. Utilizing a laser may result in a tapered opening 116, as shown in FIG. 3, as well as a laser slag or laser residue 126 formed along the wall(s) 118 of the opening 116. Also, while the opening 116 is shown to be tapered, such a shape of the opening 116 is not required for practicing the presently disclosed technology, but is a shape not uncommon to substrate openings.

Figure 4:
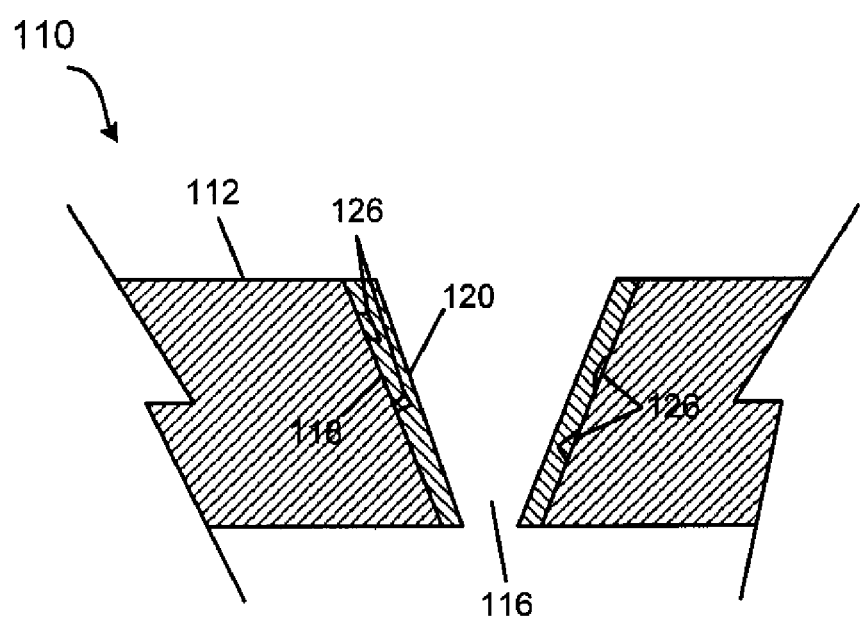
FIG. 4 is an illustration of a cross-sectional view of the via of FIG. 3 metalized with a metallic adhesion layer, in accordance with the first exemplary embodiment of the present disclosure.

FIG. 4 is an illustration of a cross-sectional view of the via 110 of FIG. 3 metalized with a metallic adhesion layer 120, in accordance with the first exemplary embodiment of the present disclosure. The metallic adhesion layer 120 is formed in the opening 116 against the wall 118. The metallic adhesion layer 120 is chemically bonded to the wall 118. The metallic adhesion layer 120 may be titanium, tungsten-titanium, molybdenum and/or nickel, as examples. These, and other metallic adhesion layers, may be provided to allow for an improved chemical bond between the braze fill material 122 (not shown) and the substrate 112.

Figure 5:
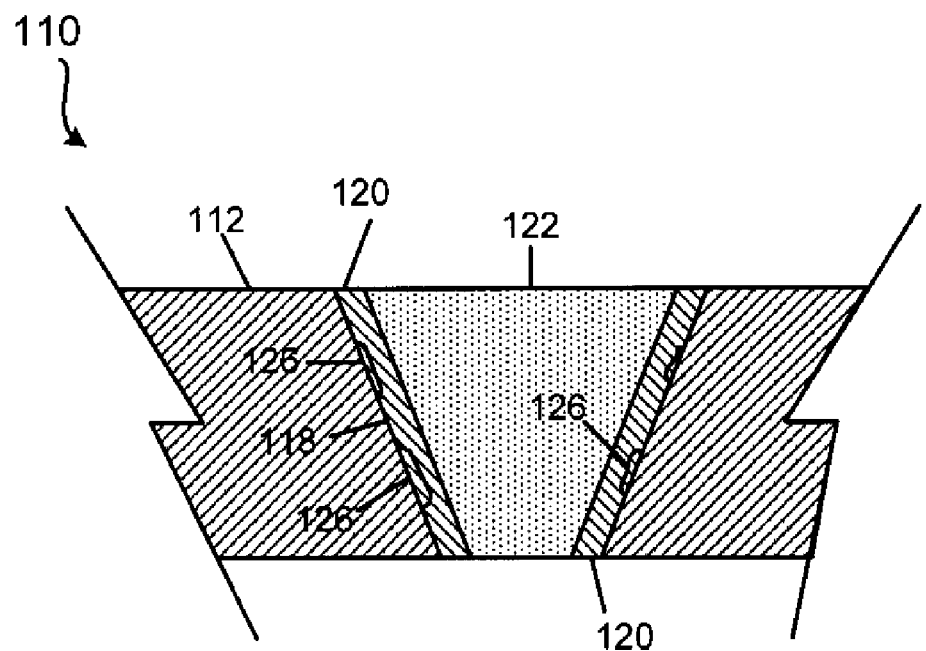
FIG. 5 is an illustration of a cross-sectional view of the via of FIG. 4 filled with a braze fill material, in accordance with the first exemplary embodiment of the present disclosure.

FIG. 5 is an illustration of a cross-sectional view of the via 110 of FIG. 4 filled with a braze fill material 122, in accordance with the first exemplary embodiment of the present disclosure. The braze fill material 122 is deposited in each via against the metallic adhesion layer 120 and heated to an approximate melting temperature of the braze fill material 120, then allowed to cool. The braze fill material 120 may be heated up to approximately 1000 degrees Celsius to melt the braze fill material 120. The entirety of the braze fill material 122 may be applied in a single step. The melting of the braze fill material 122 may be completed within a vacuum chamber, inert gas atmosphere furnace, or other controlled atmosphere container to limit oxidation of at least of the braze fill material 122, the metallic adhesion layer, and/or any elements thereof. The braze fill material 122 may be made flush with the substrate 112 on both sides of the substrate 112. The braze fill material 122 may need to be scraped to bring it flush with the substrate 112.

The braze fill material 122 may be a single metal, such as gold, or it may be an alloy such as TiCuSiI. The metallic adhesion layer 120 is used to cover the laser residue 126. Once the metallic adhesion layer 120 is applied, the braze fill material 122 may be applied. The braze fill material 122 may be heated to an approximate melting point of the braze fill material 122 and completing the bonding to the metallic adhesion layer 120.

Figure 6:
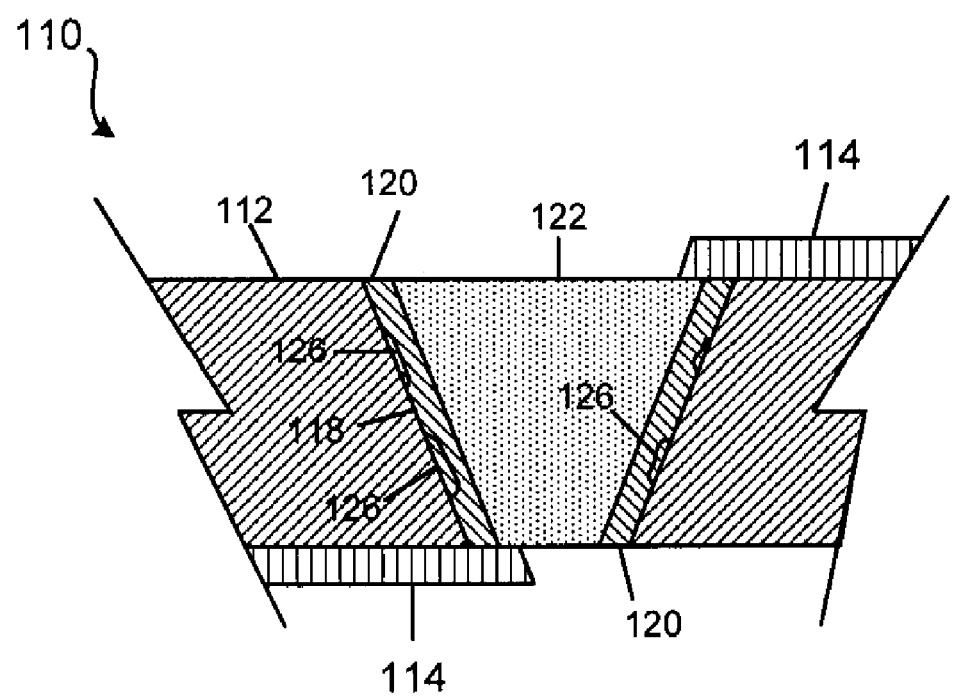
FIG. 6 is an illustration of a cross-sectional view of the via of FIG. 5 with an electrical trace applied, in accordance with the first exemplary embodiment of the present disclosure.

FIG. 6 is an illustration of a cross-sectional view of the via 110 of FIG. 5 with an electrical trace 114 applied, in accordance with the first exemplary embodiment of the present disclosure. The electrical trace 114 may be used to transmit a current that travels from one side of the substrate 112 to the other side of the substrate 112. The electrical trace 114 may be laid down in electrical contact with the previously applied braze fill material 122. In practice, the substrate with the filled via may be purchased by a customer and the electrical trace 114 may be applied by the customer.

Figure 7:
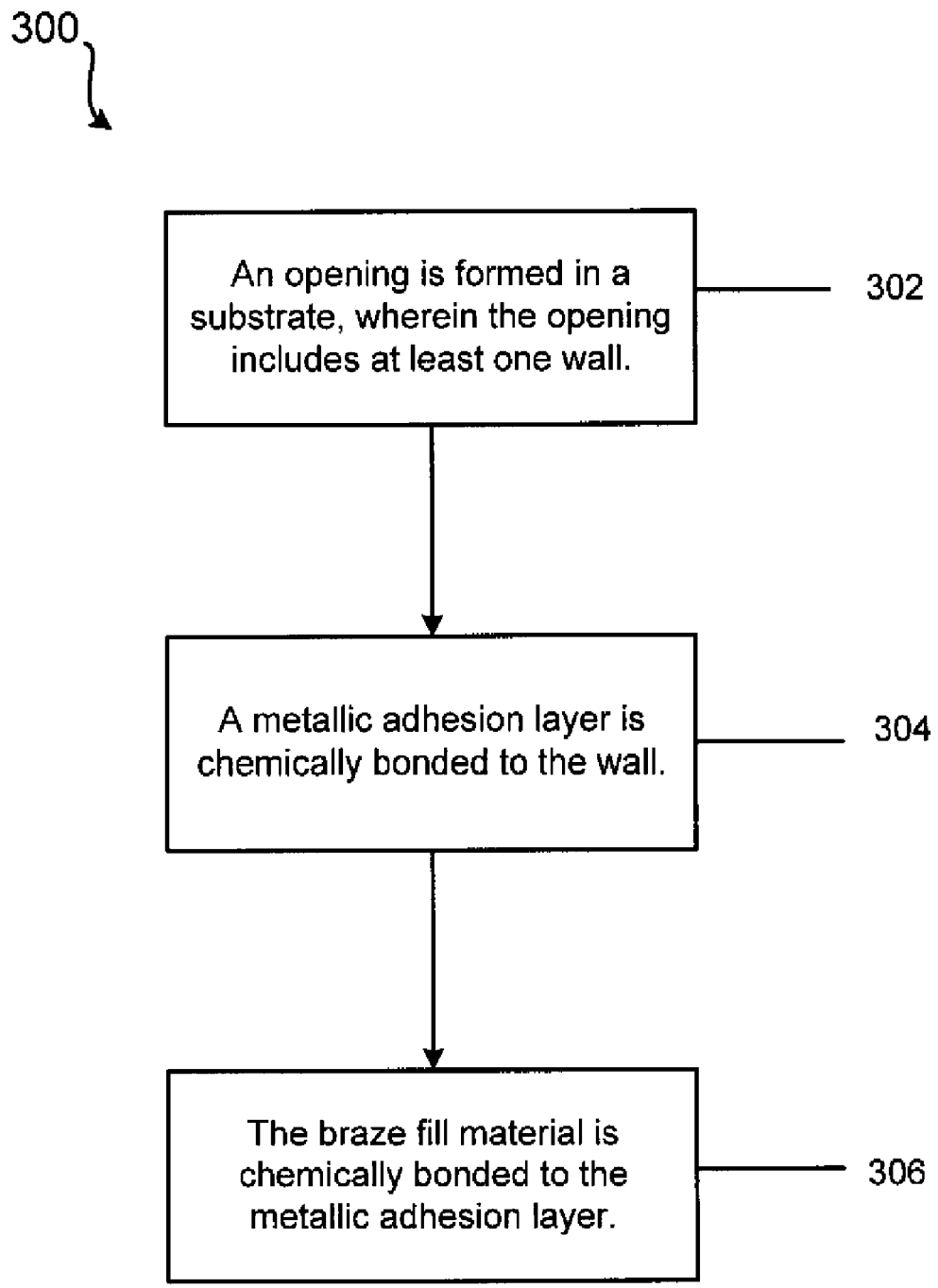
FIG. 7 is an illustration of a flowchart illustrating a method of filling the via to form the filled via of FIG. 4, in accordance with the first exemplary embodiment of the present disclosure.

FIG. 7 is an illustration of a flowchart 300 illustrating a method of filling the via 110 to form the filled via 110 of FIG. 4, in accordance with the first exemplary embodiment of the present disclosure. It should be noted that any process descriptions or blocks in flow charts should be understood as representing modules, segments, portions of code, or steps that include one or more instructions for implementing specific logical functions in the process, and alternate implementations are included within the scope of the present disclosure in which functions may be executed out of order from that shown or discussed, including substantially concurrently or in reverse order, depending on the functionality involved, as would be understood by those reasonably skilled in the art of the present disclosure.

As is shown by block 302, an opening 116 is formed in a substrate 112, wherein the opening 116 includes at least one wall 118. A metallic adhesion layer 120 is chemically bonded to the wall 118 (block 304). The braze fill material 122 is chemically bonded to the metallic adhesion layer 120 (block 306).

The metallic adhesion layer 120 and the braze fill material 122 may be chemically bonded by heating the materials to their melting points before applying them to the wall 118 of the substrate 112. The braze fill material 122 will not chemically bond directly to the wall 118 without application of the metallic adhesion layer 120 as an intermediary. The belief is that the materials that have been utilized for the braze fill material 122 cannot bond to a rough surface, such as a surface that contains laser residue 126. While it is called laser residue 126, drilling and water-jet machining can leave a similar uneven surface. The metallic adhesion layer 120 may be applied by sputtering. Either chemical bonding step may be performed in a controlled atmosphere chamber, which may be useful at least for the purpose of diminishing and/or avoiding oxidation of the metallic adhesion layer 120 or the braze fill material 122, if either material is susceptible to oxidation. The braze fill material 122 may be primarily a single metal, at least 90% by weight. The braze fill material 122 may be primarily gold, at least 90% by weight. The braze fill material 122 may be approximately 100% gold.

It should be emphasized that the above-described embodiments of the present disclosure, particularly, any "preferred" embodiments, are merely possible examples of implementations, merely set forth for a clear understanding of the principles of the disclosed system and method. Many variations and modifications may be made to the above-described embodiments of the disclosure without departing substantially from the spirit and principles of the disclosure. All such modifications and variations are intended to be included herein within the scope of this disclosure and protected by the following claims.

What is claimed is:

1. A system for a filled via, the system comprising:
   a substrate;

at least one opening formed in the substrate, the opening comprising at least one wall;

a metallic adhesion layer formed in the opening and chemically bonded to the wall;

a braze fill material is applied within the opening and chemically bonded to the metallic adhesion layer.

2. The system of claim 1, wherein the braze fill material further comprises at least 90% Au by weight.

3. The system of claim 1, wherein the braze fill material further comprises a single metal at least 90% by weight.

4. The system of claim 1, wherein the substrate substantially comprises at least one of ceramic and glass.

5. The system of claim 1, further comprising an electrical trace applied to a surface of the substrate, wherein the electrical trace contacts the braze fill material.

6. A system for a filled via, the system comprising:

a substrate;

at least one opening formed in the substrate, the opening comprising at least one wall, wherein the wall further comprises slag;

a metallic adhesion layer formed in the opening and chemically bonded to the wall;

a braze fill material is applied within the opening and chemically bonded to the metallic adhesion layer.

7. A method of forming a filled via, said method comprising the steps of:

forming an opening in a substrate, wherein the opening comprises at least one wall;

chemically bonding a metallic adhesion layer to the wall; and chemically bonding a braze fill material to the metallic adhesion layer to fill the opening.

8. The method of claim 7, wherein the braze fill material is scraped down to a level flush with the substrate.

9. The method of claim 7, wherein the step of chemically bonding the braze fill material to the metallic adhesion layer is performed within a controlled atmosphere chamber.

10. The method of claim 7, wherein the step of chemically bonding the metallic adhesion layer to the wall further comprises sputtering the metallic adhesion layer to the wall within a controlled atmosphere chamber.

11. The method of claim 10, wherein the braze fill material further comprises a single metal at least 95% by weight.

12. The method of claim 10, further comprising the step of chemically bonding the braze fill material to the metallic adhesion layer within the opening in the controlled atmosphere chamber.

13. The method of claim 10, wherein the metallic adhesion layer further comprises titanium.

14. The method of claim 7, wherein the step of chemically bonding the braze fill material further comprises the step of heating the braze fill material to at least approximately 1000 degrees Celsius.

15. The method of claim 7, wherein the step of chemically bonding the braze fill material further comprises the step of heating the braze fill material to at least an approximate melting point of the braze fill material.

16. The method of claim 7, wherein the braze fill material further comprises at least 90% Au by weight.

17. A system for forming a filled via, said system comprising:

means for forming an opening in a substrate, wherein the opening comprises at least one wall;

means for chemically bonding a metallic adhesion layer to the wall; and means for chemically bonding a braze fill material to the metallic adhesion layer to fill the opening.

18. The system of claim 17, further comprising means for sputtering the metallic adhesion layer to the wall in a controlled atmosphere.

19. The system of claim 17, further comprising means for chemically bonding the braze fill material at a melting point of the braze fill material.

20. The system of claim 17, further comprising means for conducting current through the braze fill material.

* * * * *